US010743426B2

(12) United States Patent
Hong et al.

(10) Patent No.: US 10,743,426 B2
(45) Date of Patent: Aug. 11, 2020

(54) DISPLAY CONTROL MODULE AND DISPLAY DEVICE INCLUDING THE SAME

(71) Applicant: LG ELECTRONICS INC., Seoul (KR)

(72) Inventors: Daewoon Hong, Seoul (KR); Sangtae Park, Seoul (KR); Dongjin Yoon, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/151,237

(22) Filed: Oct. 3, 2018

(65) Prior Publication Data
US 2019/0037711 A1 Jan. 31, 2019

Related U.S. Application Data

(63) Continuation of application No. 15/662,217, filed on Jul. 27, 2017, now Pat. No. 10,123,435.
(Continued)

(30) Foreign Application Priority Data

Jun. 16, 2017 (KR) .......................... 10-2017-0076378

(51) Int. Cl.
G06F 1/00 (2006.01)
G06F 1/16 (2006.01)
(Continued)

(52) U.S. Cl.
CPC ............. H05K 5/0017 (2013.01); F21V 3/02 (2013.01); F21V 19/0015 (2013.01);
(Continued)

(58) Field of Classification Search
CPC ... G06F 1/00; G06F 1/16; H04M 1/02; H05K 5/03
(Continued)

(56) References Cited

U.S. PATENT DOCUMENTS 8,988,876 B2 * 3/2015 Corbin ................. A45C 13/002
361/679.58
9,069,519 B1 6/2015 Hall
(Continued)

FOREIGN PATENT DOCUMENTS

CN 103917071 7/2014
CN 105938688 9/2016

OTHER PUBLICATIONS

State Intellectual Property Office of the People's Republic of China Application Serial No. 201810106476.1, Office Action dated Nov. 12, 2019, 12 pages.

Primary Examiner — Xiaoliang Chen
(74) Attorney, Agent, or Firm — Lee, Hong, Degerman, Kang & Waimey

(57) ABSTRACT

Disclosed is a display control module including a supporting member including a pair of external coupling parts for attaching to an external surface in a negative Y-axis direction and a pair of guide surfaces configured to form opposite side ends of the external coupling parts in an X-axis direction; and a PCB coupled to the supporting member in a positive Y-axis direction, the PCB being provided at opposite sides of the PCB in the X-axis direction with a pair of connection terminals configured to be connected to a pair of display modules, respectively, and a display device including a pair of display modules; a supporting member positioned between the pair of display modules in an X-axis direction; and a printed circuit board coupled to the supporting member in a positive Y-axis direction, wherein the display (Continued)

modules are connected to opposite sides of the PCB in the X-axis direction.

9 Claims, 12 Drawing Sheets

Related U.S. Application Data

(60) Provisional application No. 62/453,535, filed on Feb. 2, 2017.

(51) Int. Cl.
| | |
|---|---|
| *H04M 1/02* | (2006.01) |
| *H05K 5/03* | (2006.01) |
| *H05K 5/00* | (2006.01) |
| *F21V 19/00* | (2006.01) |
| *F21V 3/02* | (2006.01) |
| *G09F 9/302* | (2006.01) |
| *F21Y 115/10* | (2016.01) |
| *G09G 5/00* | (2006.01) |
| *G09G 5/12* | (2006.01) |

(52) U.S. Cl.
CPC ......... *G09F 9/3026* (2013.01); *H05K 5/0021* (2013.01); *F21Y 2115/10* (2016.08); *G09G 5/003* (2013.01); *G09G 5/12* (2013.01)

(58) Field of Classification Search
USPC .. 361/752, 749, 728, 679.3, 679.09, 679.27, 361/679.58, 721, 803, 807; 428/138
See application file for complete search history.

(56) References Cited

U.S. PATENT DOCUMENTS

| | | | |
|---|---|---|---|
| 9,874,908 B2 * | 1/2018 | Han | G06F 1/1684 |
| 2013/0077221 A1 * | 3/2013 | Becze | G06F 3/1438 |
| | | | 361/679.3 |
| 2014/0205799 A1 * | 7/2014 | Lin | B29C 65/08 |
| | | | 428/138 |
| 2016/0187938 A1 * | 6/2016 | Han | G06F 1/1684 |
| | | | 361/679.27 |
| 2016/0357055 A1 | 12/2016 | Yeo | |
| 2017/0017108 A1 | 1/2017 | Shin et al. | |

* cited by examiner

DISPLAY CONTROL MODULE AND DISPLAY DEVICE INCLUDING THE SAME

CROSS-REFERENCE TO RELATED APPLICATIONS

This application is a continuation of U.S. patent application Ser. No. 15/662,217, filed on Jul. 27, 2017, now U.S. Pat. No. 10,123,435, which claims the benefit of earlier filing date and right of priority to U.S. Provisional Application No. 62/453,535, filed on Feb. 2, 2017, and also claims the benefit of Korean Application No. 10-2017-0076378, filed on Jun. 16, 2017, the contents of which are all incorporated by reference herein in their entirety.

BACKGROUND OF THE INVENTION

1. Field of the Invention

The present invention relates to a display control module that controls a display module and a display device including the same.

2. Description of the Related Art

There are various kinds of display modules that realize images. For example, there are a liquid crystal display panel, a light emitting diode display panel, a plasma display panel, and an organic light emitting diode display panel. In addition, a film type display module that realizes images is also known. The film type display module is transparent and flexible.

Meanwhile, display devices may be classified into display devices that are manufactured as finished products at factories and display devices that are manufactured as modules at factories and are finally assembled and installed on site. For a display device for on-site installation, a display module and a display control module for controlling the display module may be manufactured separately. Known is a display device for on-site installation configured such that a film-type display module and a display control module are attached to the surface of a window.

SUMMARY OF THE INVENTION

It is a first object of the present invention to improve the convenience of installation of a display device on site.

It is a second object of the present invention to improve the convenience and accuracy of arrangement of a plurality of film-type display modules configured to be attached to an external surface when the display modules are installed on site.

It is a third object of the present invention to improve the unity of images output by a plurality of display modules when the display modules are installed on site.

It is a fourth object of the present invention to minimize visually unnecessary parts of a film-type display module configured to be attached to an external surface from being emphasized or a phenomenon in which recognition of images output by the display module is reduced.

It is a fifth object of the present invention to enable a film-type display module to be more strongly attached to an external surface when the display module is installed on site.

It is a sixth object of the present invention to safely protect the connection between a display module and a printed circuit board (PCB) and the PCB after a display device is installed on site.

In accordance with an aspect of the present invention, the above and other objects can be accomplished by the provision of a display device including a pair of display modules, a supporting member positioned between the pair of display modules in an X-axis direction in an XYZ rectangular coordinate system, and at least one printed circuit board (PCB) coupled to the supporting member in a positive Y-axis direction for controlling the display modules, wherein the display modules are configured to be connected to opposite sides of the PCB in the X-axis direction.

the supporting member may be configured to be attached to an external surface in a negative Y-axis direction, and the display modules may be configured to be attached to the external surface in the negative Y-axis direction.

the supporting member may comprise an external coupling part for attaching to the external surface in the negative Y-axis direction, and a pair of guide surfaces forming opposite side ends of the external coupling part in the X-axis direction.

The display modules may be configured such that side ends of the display modules contact the respective guide surfaces.

The guide surfaces may be disposed so as to be parallel to each other.

Each of the display modules may comprise a plurality of light emitting diodes (LEDs) spaced apart from each other in the X-axis direction by a predetermined distance, and a length between the guide surfaces in the X-axis direction may be smaller than the predetermined distance.

the display modules may comprise a first display module disposed in a negative X-axis direction, and a second display module disposed in a positive X-axis direction. A sum of a first length between a closest LED of the first display module in the positive X-axis direction and a side end of the first display module in the positive X-axis direction, a second length between a closest LED of the second display module in the negative X-axis direction and a side end of the second display module in the negative X-axis direction, and the X-axis direction length may be equal to the predetermined distance.

The supporting member may comprise a guide unit comprising the external coupling part and the guide surfaces, and a base unit connected to a side of the guide unit in the positive Y-axis direction and coupled to the at least one PCB, and the display device further comprises a sealing member disposed at a side surface of the base unit in the negative Y-axis direction for filling a gap between the base unit and the display modules.

The supporting member may comprise a guide unit comprising the external coupling part and the guide surfaces, and a base unit connected to a side of the guide unit in the positive Y-axis direction and coupled to the at least one PCB. A width of the base unit in the X-axis direction may be greater than a width of the guide unit in the X-axis direction.

The at least one PCB may comprise a pair of connection terminals configured to be electrically connected to the display modules. The display modules may comprise connection correspondence parts disposed at the side ends adjacent to the opposite sides of the supporting member in an X-axis direction so as to be connected to the connection terminals. The supporting member may be provided with connection holes through which the connection correspondence parts pass.

The supporting member may comprise a pair of case guides, protruding from opposite sides of the supporting member in the X-axis direction, in the positive Y-axis direction. The display device further may comprise a case comprising a pair of side parts into which the case guides are inserted and an upper surface part extending while connecting the side parts to each other.

In accordance with another aspect of the present invention, there is provided a display control module including a supporting member comprising a pair of external coupling parts for attaching to an external surface in a negative Y-axis direction and a pair of guide surfaces configured to form opposite side ends of the external coupling parts in an X-axis direction, and at least one PCB coupled to the supporting member in a positive Y-axis direction, the at least one PCB being provided at opposite sides of the at least one PCB in the X-axis direction with a pair of connection terminals configured to be connected to a pair of display modules, respectively.

The supporting member may comprise a PCB coupling portion protruding in the positive Y-axis direction and coupled to the at least one PCB.

the at least one PCB may be disposed such that a thickness of the at least one PCB in the X-axis direction is smaller than a width of the at least one PCB in a Y-axis direction.

The supporting member may comprise a guide unit comprising the external coupling parts and the guide surfaces. A width of the guide unit in the X-axis direction may be less than a width of at least one PCB in the Y-axis direction.

The at least one PCB may comprise a board, and the connection terminals may be disposed at opposite side surfaces of the board in the X-axis direction, respectively.

The supporting member may comprise a guide unit comprising the external coupling parts and the guide surfaces, and a base unit connected to a side of the guide unit in the positive Y-axis direction and coupled to the at least one PCB. The base unit may comprise a cover portion disposed in the negative Y-axis direction, and a width of the cover portion in the X-axis direction may be greater than a width of the guide unit in the X-axis direction.

The base unit may comprise a support protruding from the cover portion in the negative Y-axis direction and spaced apart from the guide surfaces.

A side surface of the cover portion in the negative Y-axis direction may obliquely extend from distal ends of the guide surfaces in the positive Y-axis direction to a region between the X-axis direction and the positive Y-axis direction.

The guide unit and the base unit may be formed separately and fastened to each other.

BRIEF DESCRIPTION OF THE DRAWINGS

The accompanying drawings, which are included to provide a further understanding of the invention and which are incorporated in and constitute a part of this application, illustrate embodiments of the invention and together with the description serve to explain the principle of the invention. In the drawings:

FIGS. 1A and 1B are perspective views showing a display device according to the present invention, wherein FIG. 1A shows a display device installed on site in accordance with an embodiment and FIG. 1A shows a display device installed on site in accordance with another embodiment;

FIGS. 5A to 5E are sectional views showing the display control module and the display modules taken along line S2-S2' of FIG. 2, wherein FIG. 5A shows a display control module according to a first embodiment, FIG. 5B shows a display control module according to a second embodiment, FIG. 5C shows a display control module according to a third embodiment, FIG. 5D shows a display control module according to a fourth embodiment, and FIG. 5E shows a display control module according to a fifth embodiment;

DETAILED DESCRIPTION OF THE PREFERRED EMBODIMENTS

Figure 1A:
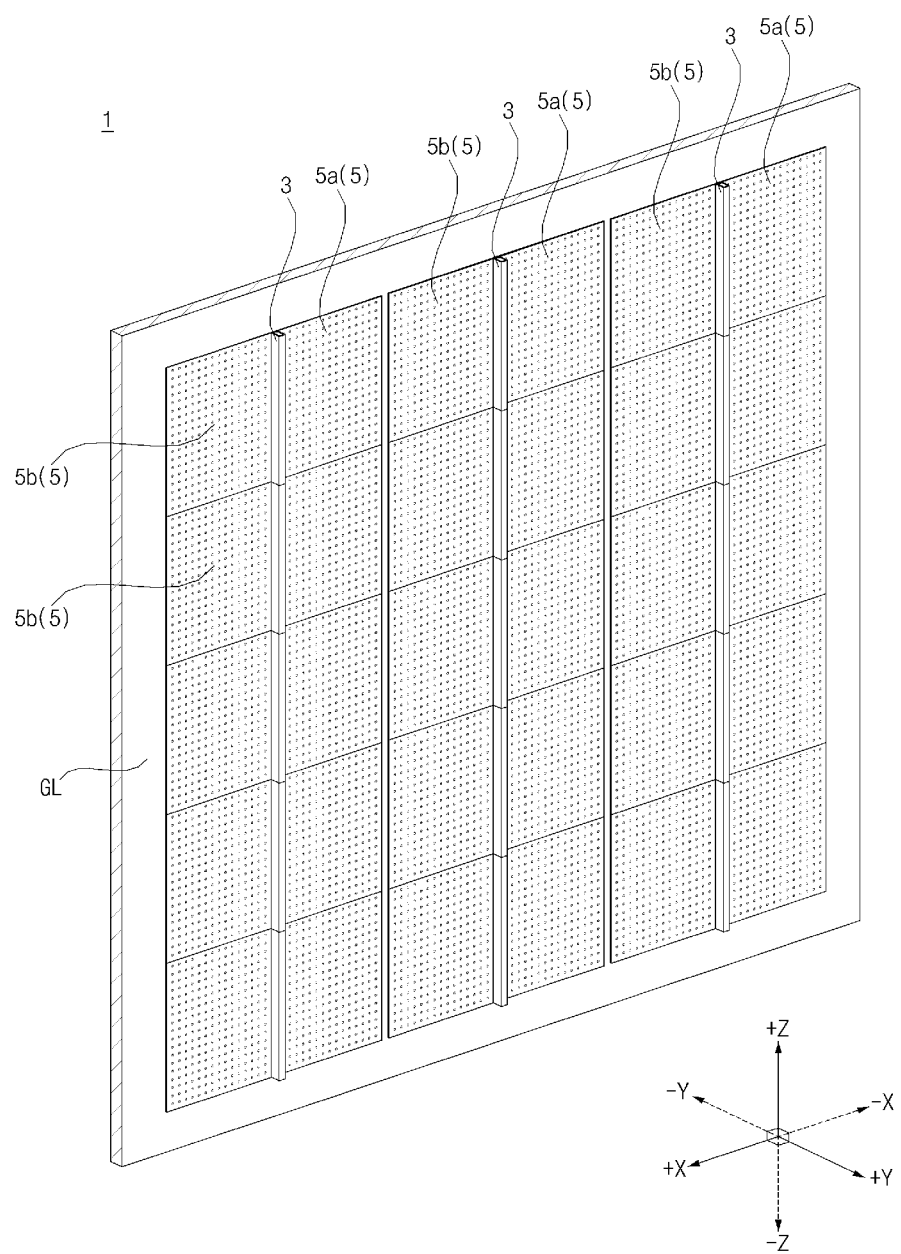

The present invention may be described based on a rectangular coordinate system defined by an X axis, a Y axis, and a Z axis, which are perpendicular to each other, shown in the drawings. Each axial direction (i.e. the X-axis direction, the Y-axis direction, and the Z-axis direction) a two-way direction in which each axis extends. Each positive axis direction (i.e. the positive X-axis direction, the positive Y-axis direction, and the positive Z-axis direction) is one-side direction of the two-way direction in which each axis extends, and is generally denoted by the symbol "+". Each negative axis direction (i.e. the negative X-axis direction, the negative Y-axis direction, and the negative Z-axis direction) is the other-side direction of the two-way direction in which each axis extends, and is generally denoted by the symbol "−".

Figure 1B:
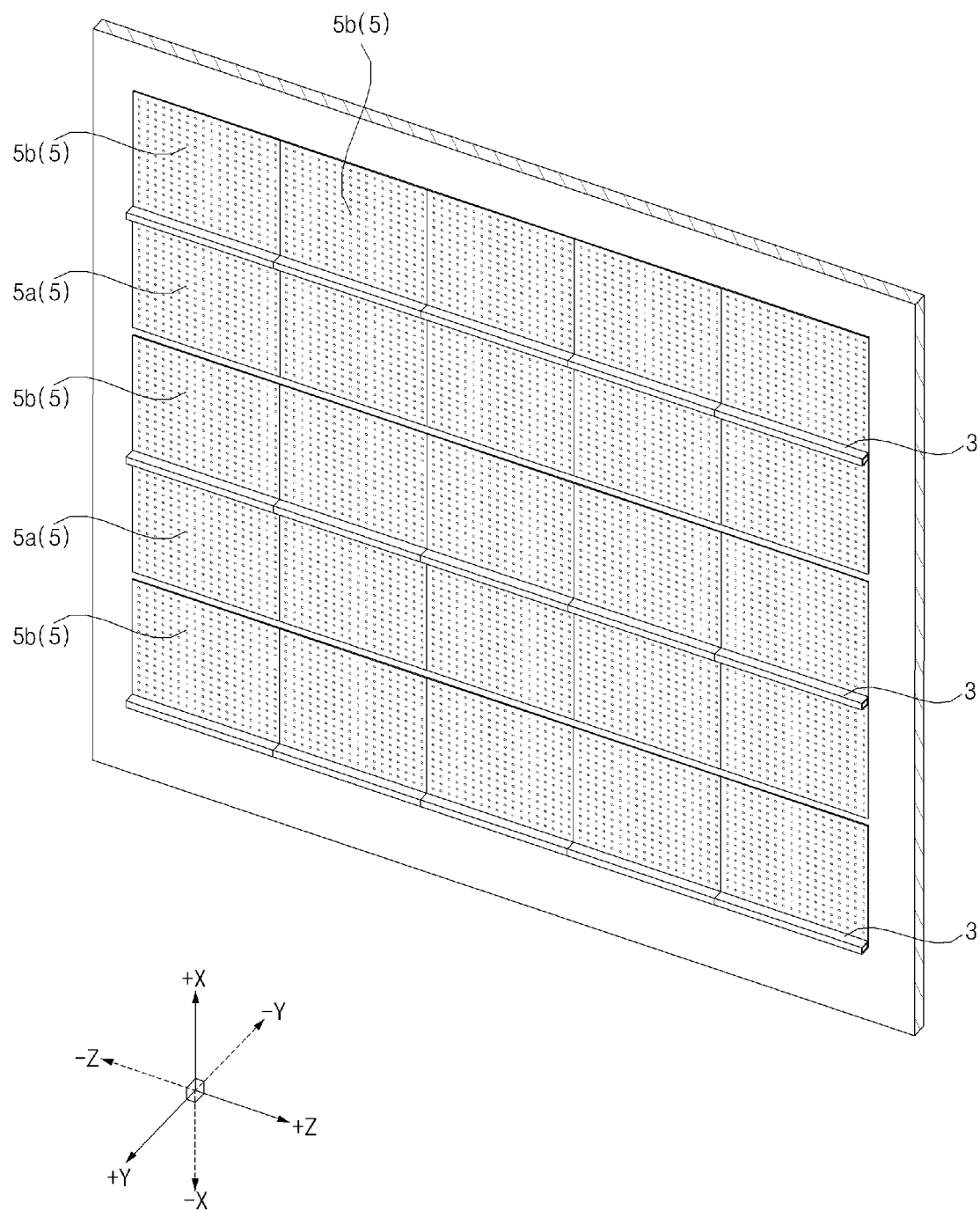
Figure 2:
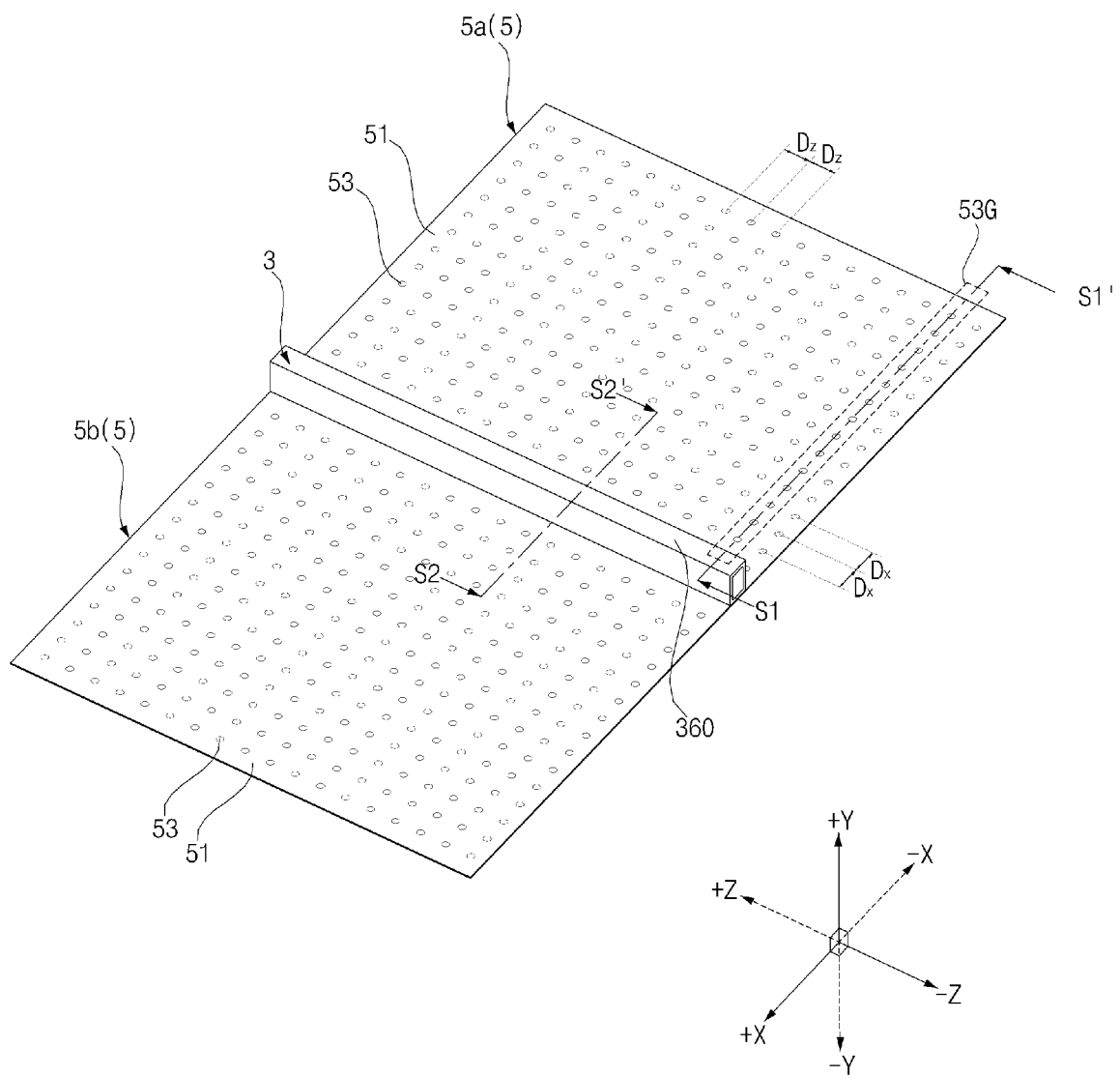
FIG. 2 is a perspective view showing one of the display control modules shown in FIGS. 1A and 1B and a pair of display modules connected thereto.
Figure 3:
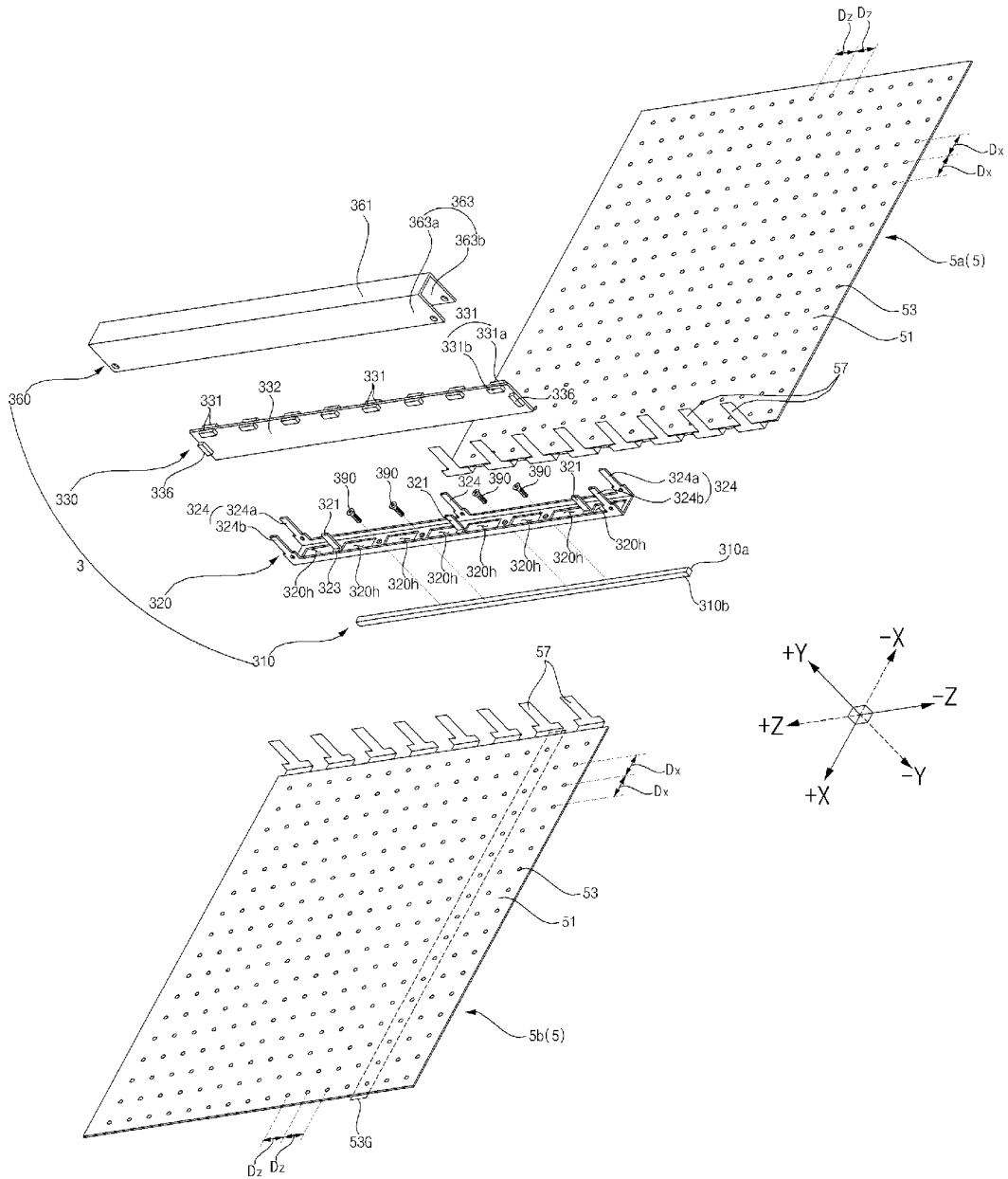
FIG. 3 is an exploded perspective view of the display control module and the display modules shown in FIG. 2.

In this specification, the X-axis direction, the Y-axis direction, and the Z-axis direction are defined based on one display control module. In the XYZ rectangular coordinate system, the X-axis direction is defined as the direction in which a pair of display modules is connected to the display control module, and the negative Y-axis direction is defined as the direction in which a display device is coupled to an external surface. In FIGS. 1 and 1B, the external surface is flat. Consequently, the X-axis, Y-axis, and Z-axis directions are uniform in any one selected from among a plurality of display control modules. In the case in which the external surface is curved, the X-axis, Y-axis, and Z-axis directions may be changed depending on which of the display control modules is selected.

The display device may be coupled to the external surface such that any one direction on the external surface is the X-axis direction. In FIG. 1A, it may be understood that the X-axis direction is the leftward-rightward direction, the Z-axis direction is the upward-downward direction, and the Y-axis direction is the forward-rearward direction. In addition, in FIG. 1B, it may be understood that the X-axis direction is the upward-downward direction, the Z-axis direction is the leftward-rightward direction, and the Y-axis direction is the forward-rearward direction. It is not always necessary for the X-axis direction to be the upward-downward direction or the leftward-rightward direction. In addition, the terms "upward," "downward," "leftward," "rightward," "forward," and "rearward" are given only for clear understanding of the present invention, and the directions may be defined differently depending on the circumstances.

According to the present invention, parts are manufactured at a factory and are then assembled on site, whereby a display device is installed. However, the present invention is not limited thereto.

The display device may be installed to an external surface, such as the window or wall of a building, the window of a transportation means, including a car, or the surface of any other object.

In addition, the display device may be installed to a curved surface as well as a flat surface. For example, in the case in which the external surface has a curvature in one direction, a pair of display modules may be connected to a display control module while being arranged in the direction in which the curvature is formed.

In the following description, the terms "first," "second," etc. are used only to avoid confusion between designated components, and do not indicate the sequence or importance of the components or the relationships between the components. For example, a second component may be included alone without a first component.

Referring to FIGS. 1A to 4, a display device 1 according to an embodiment of the present invention includes a display module 5 that displays images. The display module 5 is coupled to an external surface. The display device 1 includes a display control module 3 that controls the output of images from the display module 5. The display control module 3 controls the supply of power to the display module 5. The display control module 3 is coupled to the external surface. The display control module 3 includes a supporting member 30 configured to be coupled to the external surface and at least one printed circuit board (PCB) 330 coupled to the supporting member 30. The display control module 3 may further include a case 360 that receives the PCB 330.

The display module 5 outputs images in the negative Y-axis direction (i.e. in the forward direction). In one example, the display module 5 may be a light emitting diode (LED) display module. In another example, the display module 5 may be a liquid crystal display (LCD) module. In yet another example, the display module 5 may be any one selected from among a plasma display panel (PDP), a field emission display (FED) module, and an organic light emitting display (OLED) module. Hereinafter, the display module 5 will be described as being an LED display module. However, the present invention is not limited thereto.

The display module 5 may be flexible. The display module 5 may be flexible in the X-axis direction.

The display module 5 may be a film type display module. The display module may be a film type display module having a given thickness in the Y-axis direction.

The display module 5 may be transparent. Images from the display module 5 may be output in the rearward direction (i.e. in the positive Y-axis direction) as well as in the forward direction (i.e. in the negative Y-axis direction). The display module 5 may be transparent such that light from one LED 53 is emitted in both directions (i.e. in the forward and rearward directions).

The display module 5 may be coupled to the surface of an object (e.g. a window) outside the display device 1 (hereinafter, referred to as an "external surface"). In this embodiment, the external surface will be described as being the surface of a glass panel GL. However, the present invention is not limited thereto. The display module 5 may have a surface for attachment configured to be coupled to the external surface.

The surface for attachment is provided at the side of the display module 5 in the negative Y-axis direction. The display module 5 may be manufactured at a factory in the state in which a protective film is attached to the surface for attachment. When the display device 1 is installed on site, the protective film may be separated from the surface for attachment, and the surface for attachment may be brought into contact the external surface such that the display module 5 is coupled to the external surface.

A pair of display modules 5a and 5b may be provided at opposite sides of the display control module 3 in the X-axis direction. The display modules 5a and 5b may be disposed at opposite sides of the supporting member 30 in the X-axis direction. The display modules 5a and 5b are electrically connected to the PCB 330. The display modules 5a and 5b are provided at opposite sides of the display control module 3 in the X-axis direction so as to be connected to the PCB 330. Depending on the on-site situation, however, the display module 5 may be disposed only at one side of the supporting member 30 in the X-axis direction (i.e. at the side of the supporting member in the positive X-axis direction or in the negative X-axis direction). For example, as shown in FIG. 1B, the display module 5 may be disposed only at the side of the lowermost display control module 3 in the positive X-axis direction.

The display control module 3 includes a pair of guide surfaces 310a and 310b, a description of which will follow. The display modules 5a and 5b contact side ends of the guide surfaces 310a and 310b. The display modules 5a and 5b include a first display module 5a disposed in the negative X-axis direction and a second display module 5b disposed in the positive X-axis direction. On the basis of the display control module 3 disposed between the display modules 5a and 5b, the first display module 5a is disposed in the negative X-axis direction while the second display module 5b is disposed in the positive X-axis direction. The first display module 5a and the second display module 5b may be symmetric with respect to the display control module 3. In addition, the first display module 5a and the second display module 5b may be the same. The description of the display module 5 may equally apply to the display modules 5a and 5b.

The display module 5 may be provided with a pair of side ends in the X-axis direction. The display module 5 may be provided with a pair of side ends in the Z-axis direction. The side ends of the display module 5 in the X-axis direction and the side ends of the display module 5 in the Z-axis direction may form a quadrangle. The display module 5 may have a rectangular shape when viewed in the Y-axis direction. The display module 5 may have a square shape.

The display module 5 is provided with a side end that contacts a guide unit 310, a description of which will follow. The side end of the display module 5 that contacts the guide unit 310 is formed in the X-axis direction. The side end of the first display module 5a in the positive X-axis direction is configured to contact the guide unit 310. The side end of the second display module 5b in the negative X-axis direction is configured to contact the guide unit 310.

The display module 5 may include a plurality of LEDs 53. The LEDs 53 emit light at least in the negative Y-axis direction. The LEDs 53 are disposed on a film 51.

The LEDs 53 may be spaced apart from each other by a predetermined distance Dx in the X-axis direction. The LEDs 53 may be spaced apart from each other by a predetermined arrangement distance Dz in the Z-axis direction. The LEDs 53 may be disposed on the film 51 in a lattice arrangement.

The display module 5 may include an LED array group 53G constituted by a plurality of LEDs 53 arranged in the X-axis direction. The LEDs 53 of the LED array group 53G are spaced apart from each other by a predetermined distance Dx in the X-axis direction. In this embodiment, the LED array group 53G is constituted by 16 LEDs 53.

The display module 5 may include a plurality of LED array groups 53G arranged in the Z-axis direction. The LED array groups 53G are spaced apart from each other by a predetermined arrangement distance Dz in the Z-axis direction. The LED array groups 53G are constituted by n LEDs 53. The LEDs 53 of the display module 5 may be constituted by n LED array groups 53G (n being a natural number equal to or greater than 2). The distance Dx and the arrangement distance Dz may be the same. In this embodiment, the LEDs 53 of the display module 5 are constituted by 16 LED array groups 53G.

One of the LEDs 53 arranged in the X-axis direction that is closest to the display control module 3 may be defined as the closest LED 53a. The LED array group 53G includes the closest LED 53a. Each of the LED array groups 53G includes the closest LED 53a. The closest LED 53a, among the LEDs 53 of the LED array group 53G, is closest to a connection correspondence part 57. The closest LED 53a is disposed so as to be close to the connection correspondence part 57 of the display module 5. The closest LED 53a of the first display module 5a is disposed at the part of the first display module 5a that is located in the positive X-axis direction, and the closest LED 53a of the second display module 5b is disposed at the part of the second display module 5b that is located in the negative X-axis direction.

Figure 4:
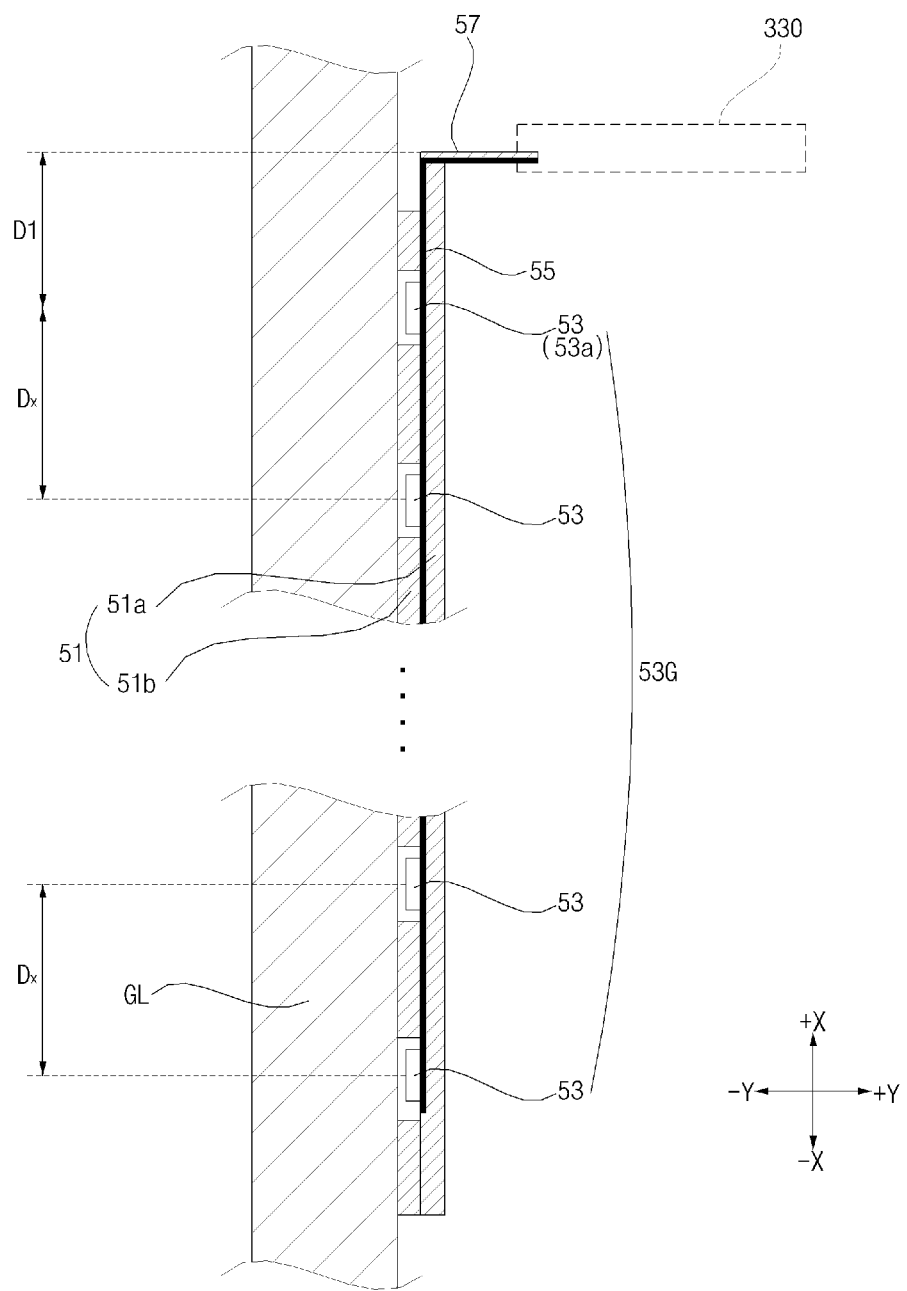
FIG. 4 is a sectional view showing one of the display modules taken along line S1-S1' of FIG. 2.
Figure 5A:
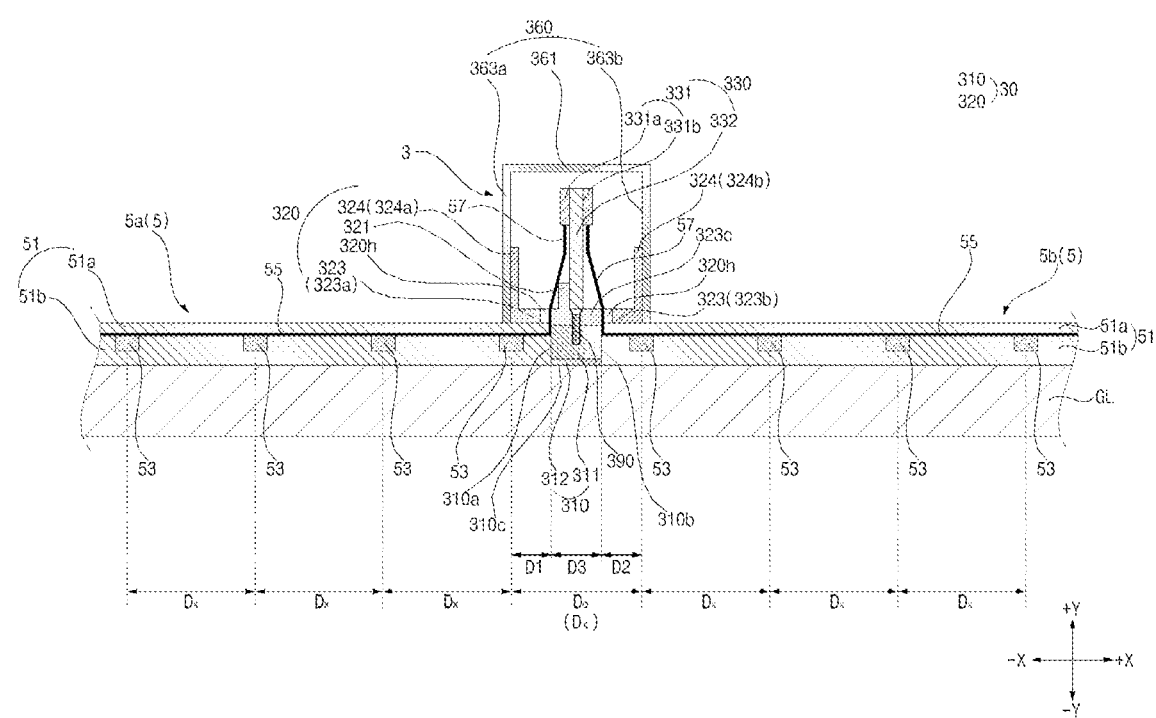
Figure 5B:
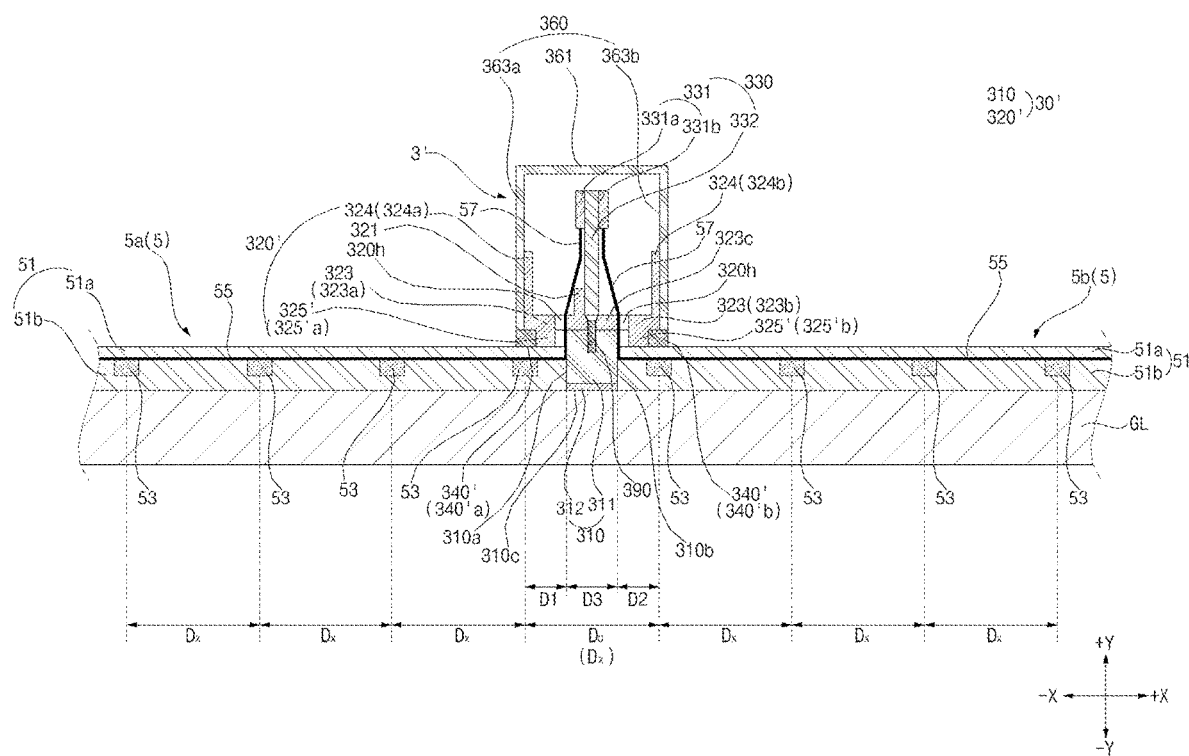
Figure 5C:
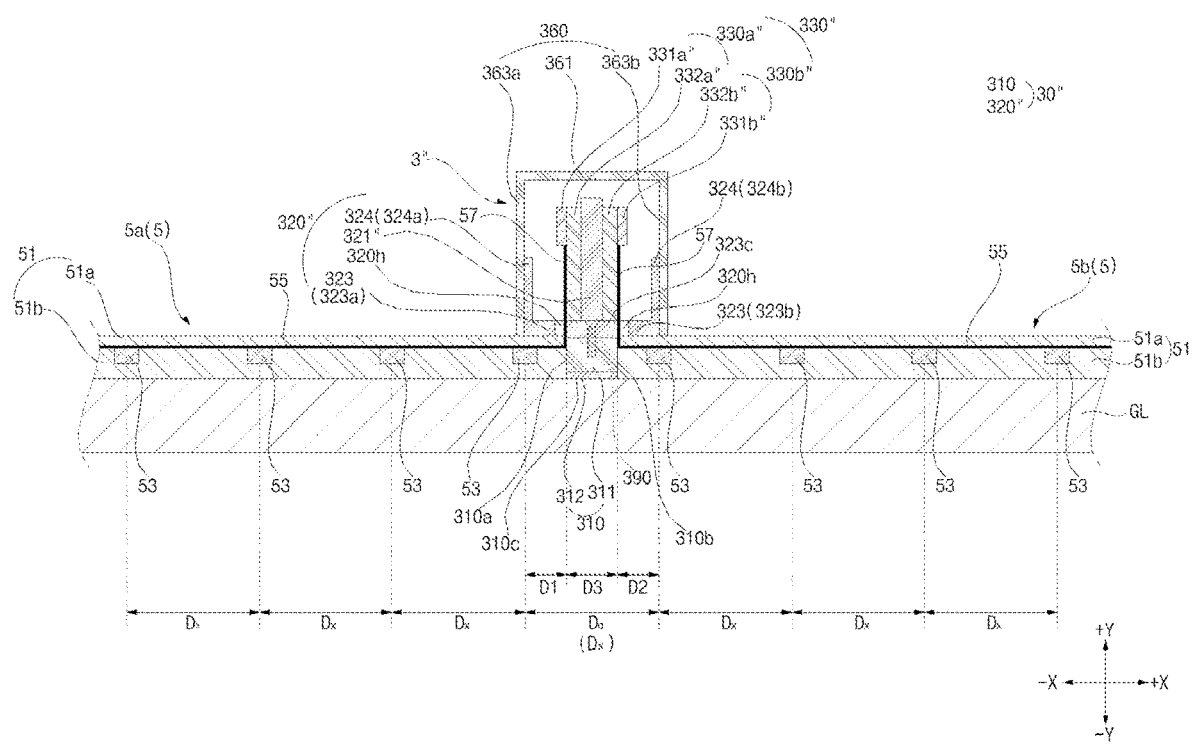
Figure 5D:
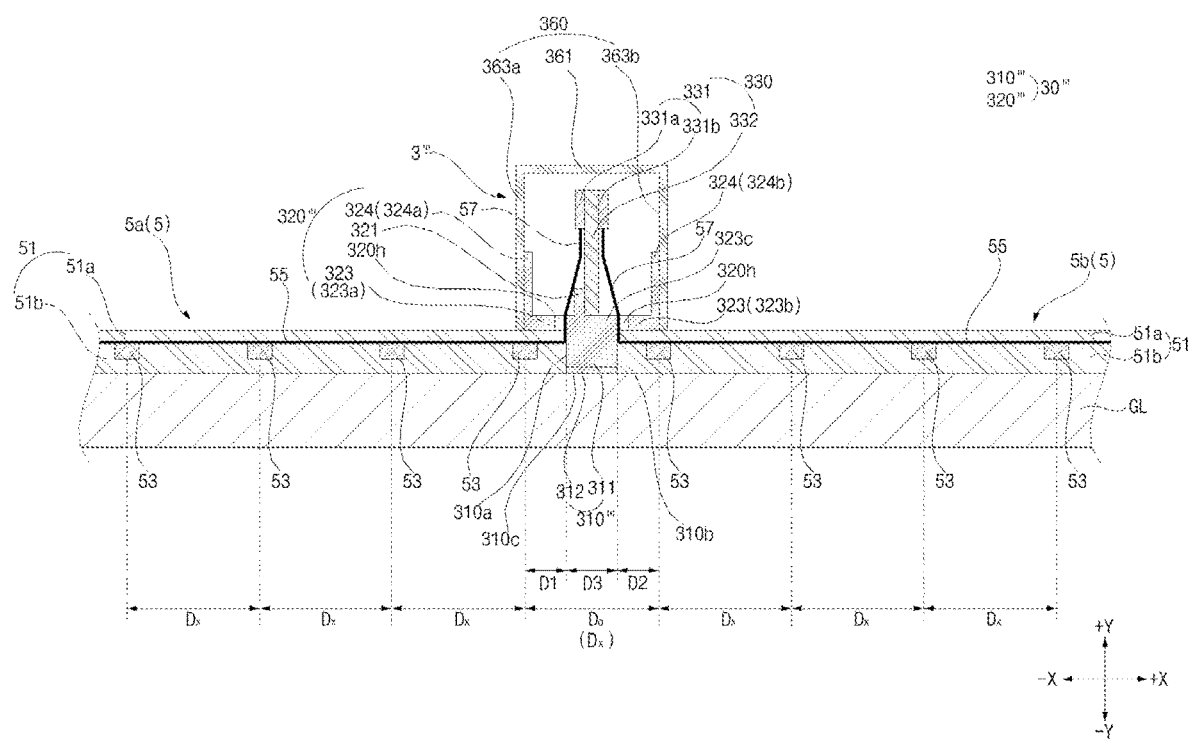
Figure 5E:
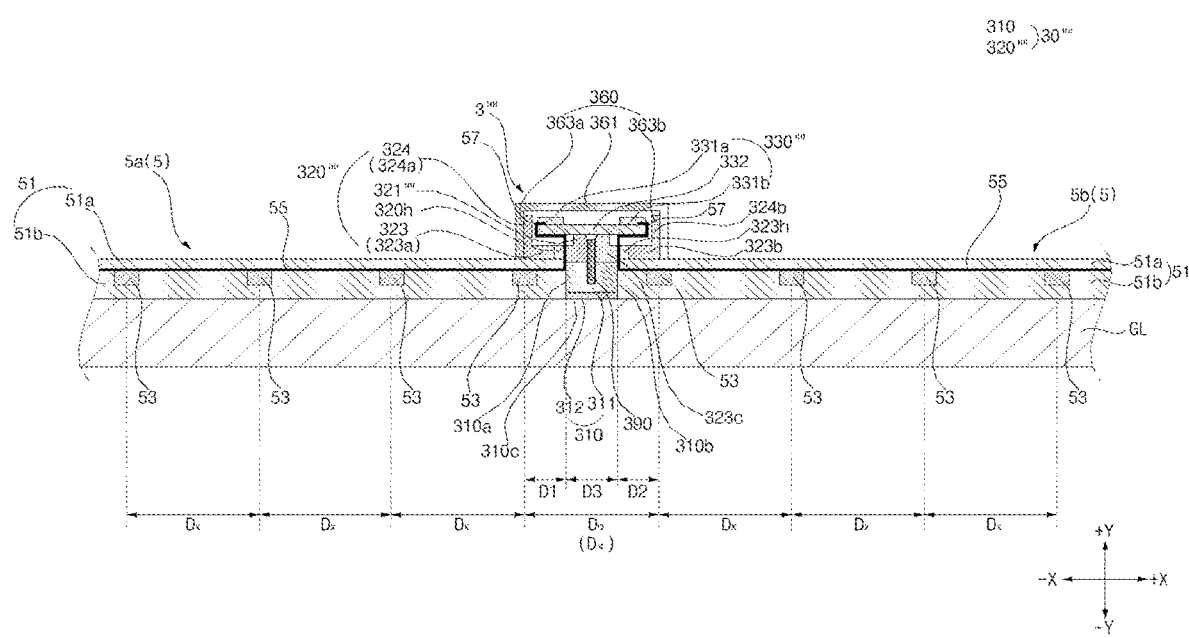

Referring to FIGS. 4 to 5E, a first length D1 is the length between the closest LED 53a of the first display module 5a in the positive X-axis direction and the side end of the first display module 5a in the positive X-axis direction. A second length D2 is the length between the closest LED 53a of the second display module 5b in the negative X-axis direction and the side end of the second display module 5b in the negative X-axis direction. The closest LED 53a of each of the LED array groups 53G of the first display module 5a is spaced apart from the side end of the first display module 5a in the positive X-axis direction by the first length D1. The closest LED 53a of each of the LED array groups 53G of the second display module 5b is spaced apart from the side end of the second display module 5b in the negative X-axis direction by the second length D2.

Referring to FIGS. 5A to 5E, an X-axis direction length D3 is the length between the guide surfaces 310a and 310b of the display control module 3. The X-axis direction length D3 is smaller than the predetermined distance Dx. Consequently, it is possible to prevent the closest LED 53a of the first display module 5a and the closest LED 53a of the second display module 5b from being excessively spaced apart from each other in the X-axis direction, thereby reducing a phenomenon in which images output from the first and second display modules 5a and 5b are recognized by a user in the state of being separated from each other.

The sum Do of the first length D1, the second length D2, and the X-axis direction length D3 may be configured to be the predetermined distance Dx. The sum of the first length D1, the second length D2, and the X-axis direction length D3 may be configured to be substantially equal to the predetermined distance Dx. Consequently, it is possible to reduce a sense of discontinuity in images generated at the interface between the closest LED 53a of the first display module 5a and the closest LED 53a of the second display module 5b, thereby improving a sense of unity of the images output from the first and second display modules 5a and 5b.

The display module may include a film 51, on which the LEDs 53 are disposed. The film 51 has a given thickness in the Y-axis direction. The film 51 may be formed in the shape of a thin sheet. The film 51 may be flexible. The film 51 may be made of a transparent material.

The film 51 may be formed by stacking a plurality of layers. The layers of the film 51 may be formed of different materials.

The film 51 includes a first layer 51a disposed in the positive Y-axis direction and a second layer 51b disposed in the negative Y-axis direction. The first layer 51a and the second layer 51b are coupled to each other. A wire 55 may be disposed between the first layer 51a and the second layer 51b. The LEDs 53 may be fixed to the first layer 51a. The second layer 51b may receive the LEDs 53.

The second layer 51b is coupled to the side surface of the first layer 51a in the negative Y-axis direction. The LEDs 53 are coupled to the side surface of the first layer 51a in the negative Y-axis direction. The surface for attachment is provided at the side surface of the second layer 51b in the negative Y-axis direction. The first layer 51a may include a plurality of layers. In addition, the second layer 51b may include a plurality of layers.

The display module 5 includes a wire 55 for guiding electricity to the LEDs 53. The wire 55 electrically connects the LEDs to the connection correspondence part 57.

The wire 55 may include a positive conductor commonly connected to the LEDs 53 in each LED array group 53G and a plurality of negative conductors connected to the respective LEDs 53 in each LED array group 53G. For example, in the case in which each LED array group 53G includes 16 LEDs 53, one positive conductor and 16 negative conductors are provided for each LED array group 53G. At least one positive conductor and at least one negative conductor that guide electricity to each LED array group 53G may be referred to as a "conductor group."

The display module 5 includes a connection correspondence part 57 connected to a connection terminal 331 of the PCB 330, a description of which will follow. The connection correspondence part 57 is disposed at the side end of the display module 5 that contacts the guide surfaces 310a and 310b. The connection correspondence part 57 is disposed at the side end of the first display module 5a in the positive X-axis direction. The connection correspondence part 57 is disposed at the side end of the second display module 5b in the negative X-axis direction.

The connection correspondence part 57 protrudes and extends from the side end of the display module 5. The connection correspondence part 57 is formed so as to be flexible. When the display device 1 is installed on site, the connection correspondence part 57 is bent from the side end of the display module 5 in the positive Y-axis direction so as to be connected to the PCB 330.

The display module 5 includes a plurality of connection correspondence parts 57. The connection correspondence parts 57 may be spaced apart from each other in the Z-axis direction. The connection correspondence parts 57 are arranged along the side end of the display module 5.

Each connection correspondence part 57 forms terminals for at least one conductor group. When the connection correspondence parts 57 are electrically connected to the PCB 330, at least one conductor group, the terminals for which are formed by each connection correspondence part 57, is electrically connected to the PCB 330. In this embodiment, each connection correspondence part 57 forms terminals for two conductor groups. That is, image signals are applied to two LED array groups 53G through one connection correspondence part 57.

Referring to FIGS. 1A to 4, the display control module 3 is disposed between a pair of display modules 5a and 5b. The display control module 3 is configured to be coupled to the external surface. The display control module 3 extends in the Z-axis direction.

The display control module 3 includes a supporting member 30 configured to be attached to the external surface. The side surface of the supporting member 30 in the negative Y-axis direction is configured to be attached to the external surface. The length of the supporting member 30 in the Z-axis direction may be substantially equal to the length of the display module 5 in the Z-axis direction.

The supporting member 30 supports at least one PCB 330. The supporting member 30 is disposed between the display modules 5a and 5b. The supporting member 30 extends in the Z-axis direction.

The supporting member 30 includes a guide unit 310 for guiding the disposition of the display modules 5a and 5b. The supporting member 30 includes a base unit 320 to which at least one PCB 330 is fixed.

The guide unit 310 provides a guide line for disposing the display modules 5a and 5b. The guide unit 310 provides a reference line with which one side end of the display module 5 in the X-axis direction comes into contact. The guide unit 310 provides a reference line with which the side end of the first display module 5a in the positive X-axis direction comes into contact. The guide unit 310 provides a reference line with which the side end of the second display module 5b in the negative X-axis direction comes into contact.

When the display device 1 is installed on site, the guide unit 310 is attached to the external surface, and then the display modules 5a and 5b may be attached to the external surface in the state of being in contact with the guide unit 310. Consequently, the positions of the display modules 5a and 5b relative to the display control module 3 are adjusted accurately.

The guide unit 310 extends in the Z-axis direction. The width of the guide unit 310 in the X-axis direction is smaller than the length of the guide unit 310 in the Z-axis direction. The guide unit 310 may have a given thickness in the Y-axis direction. The guide unit 310 may have a bar shape. The length of the guide unit 310 in the Z-axis direction may be substantially equal to the length of the display module 5 in the Z-axis direction.

The side surface of the guide unit 310 in the negative Y-axis direction may be flat. The opposite side surfaces of the guide unit 310 in the X-axis direction may be flat. The opposite side surfaces of the guide unit 310 in the X-axis direction may be perpendicular to the side surface of the guide unit 310 in the negative Y-axis direction. One of the opposite side surfaces of the guide unit 310 in the X-axis direction that is connected to the side surface of the guide unit 310 in the negative Y-axis direction may be flat and perpendicular to the side surface of the guide unit 310 in the negative Y-axis direction.

Referring to FIGS. 5A to 5E, the guide unit 310 includes an attachment member 312 configured to be attached to the external surface. For example, the attachment member 312 may be a double-side adhesive sheet. In another example, an adhesive material is applied to the side surface of the attachment member 312 in the negative Y-axis direction. The attachment member 312 is disposed at the side surface of the guide unit 310 in the negative Y-axis direction. The attachment member 312 is disposed at the side surface of a guide body 311 in the negative Y-axis direction. The opposite side surfaces of the attachment member 312 in the X-axis direction may form at least portions of the guide surfaces 310a and 310b.

The guide unit 310 includes a guide body 311 coupled to the attachment member 312. The guide body 311 is coupled to the side surface of the attachment member 312 in the positive Y-axis direction. The guide body 311 has a bar shape extending in the Z-axis direction. The opposite side surfaces of the guide body 311 in the X-axis direction may form at least portions of the guide surfaces 310a and 310b. The opposite side surfaces of the guide body 311 in the X-axis direction may be flat. The opposite side surfaces of the guide body 311 in the X-axis direction may be parallel to each other. The guide body 311 is coupled to the base unit 320. The base unit 320 is coupled to the side surface of the guide body 311 in the positive Y-axis direction.

The guide unit 310 includes an external coupling part 310c for coupling with the external surface. The external coupling part 310c is configured to be coupled to the external surface in the negative Y-axis direction of the guide unit 310. The external coupling part 310c is disposed in the negative Y-axis direction of the guide unit 310. The external coupling part 310c is disposed in the negative Y-axis direction of the attachment member 312. The external coupling part 310c may be flat.

The guide unit 310 includes a pair of guide surfaces 310a and 310b. The guide surfaces 310a and 310b are disposed at the opposite side surfaces of the guide unit 310 in the X-axis direction.

The guide surfaces 310a and 310b are configured to contact one side end of the display module 5. The guide surfaces 310a and 310b guide the positions of one side end of the display module 5.

The guide surfaces 310a and 310b include a first guide surface 310a for guiding the position of the side end of the first display module 5a in the positive X-axis direction and a second guide surface 310b for guiding the position of the side end of the second display module 5b in the negative X-axis direction. The first guide surface 310a and the second guide surface 310b are symmetric with each other in the X-axis direction.

The guide surfaces 310a and 310b form opposite side ends of the external coupling part 310c. The distal ends of the guide surfaces 310a and 310b in the negative Y-axis direction are connected to the side ends of the external coupling part 310c. The guide surfaces 310a and 310b extend from the side ends of the external coupling part 310c in the positive Y-axis direction.

The guide surfaces 310a and 310b may be flat. The guide surfaces 310a and 310b may be perpendicular to the external coupling part 310c.

The guide surfaces 310a and 310b may be disposed so as to be parallel to each other. The guide surfaces 310a and 310b extend so as to be parallel to each other. The guide surfaces 310a and 310b extend in the Z-axis direction. The guide surfaces 310a and 310b are perpendicular to the X-axis direction. When the display device 1 is installed on site, therefore, it is possible to easily dispose two facing side ends of the display modules 5a and 5b so as to be parallel to each other.

The base unit 320 is coupled to the at least one PCB 330. The base unit 320 provides a support end for the at least one PCB 330. The at least one PCB 330 is coupled to the part of the base unit 320 in the positive Y-axis direction.

The base unit 320 is coupled to the guide unit 310. The base unit 320 is connected to the side of the guide unit 310 in the positive Y-axis direction. The length of the base unit 320 in the Z-axis direction may be substantially equal to the length of the guide unit 310 in the Z-axis direction.

In the first to third and fifth embodiments, shown in FIGS. 5A to 5C and 5E, the base unit 320 and the guide unit 310 may be formed separately. In this case, the base unit 320 and the guide unit 310 may be assembled using a fastening member 390. The base unit 320 and the guide unit 310 may be coupled to each other via a fastening member 390, such as a screw. When the display device 1 is installed on site, therefore, the guide unit 310, the display modules 5a and 5b, and the base unit 320 may be sequentially installed. Consequently, it is possible to conveniently install the display modules 5a and 5b in the state of being in contact with the guide unit 310. In addition, the side end of the display module 5 that contacts the guide unit 310 is covered by the base unit 320, and the connection correspondence part 57 conveniently passes through a connection hole 320h.

In a fourth embodiment shown in FIG. 5D, a base unit 320''' and a guide unit 310''' may be formed integrally. In this case, the base unit 320''' and the guide unit 310''' may be connected to each other without an additional fastening member 390. When the display device 1 is installed on site, therefore, the process of assembling the guide unit 310 and the base unit 320 is not needed, thereby reducing the installation time. In this case, however, the process of contacting the side end of the display module 5 to the guide unit 310 and passing the connection correspondence part 57 through the connection hole 320h may be more difficult than in the first to third and fifth embodiments. In order to improve workability, therefore, an angled portion A, a description of which will follow, may be provided.

The base unit 320 includes a PCB coupling portion 321 coupled to the at least one PCB 330. The PCB coupling portion 321 protrudes in the positive Y-axis direction. The PCB coupling portion 321 is disposed at the part of the supporting member 30 that is located in the positive Y-axis direction. One side surface of the PCB coupling portion 321 and one side surface of the PCB 330 may be coupled to each other via a fastening member 390, such as a screw.

The base unit 320 includes a cover portion 323 disposed in the negative Y-axis direction. The cover portion 323 may be formed in the shape of a plate having a given thickness in the Y-axis direction. The width of the cover portion 323 in the Y-axis direction is larger than the sectional thickness of the cover portion 323 in the X-axis direction. The cover portion 323 extends in the Z-axis direction.

The width of the base unit 320 in the X-axis direction is greater than the width of the guide unit 310 in the X-axis direction. The width of the base unit 320 in the X-axis direction is greater than the width of the gap between the pair of display modules 5a and 5b in the X-axis direction. The guide unit 310 is positioned between the pair of display modules 5a and 5b such that a lengthwise axis (the Z-axis) of the guide unit 310 intersects a space between the pair of display modules 5a and 5b. The width of the cover portion 323 in the X-axis direction is configured to be larger than the width of the guide unit 310 in the X-axis direction. The part of the side surface of the cover portion 323 in the negative Y-axis direction that is not connected to the guide unit 310 faces the display module 5. Consequently, it is possible to minimize the width of the guide unit 310 in the X-axis direction, thereby sufficiently securing the area of the side surface of the supporting member in the positive Y-axis direction at which the PCB 330 is disposed and improving workability while mitigating an increase in the size of the visible portion of the border area of the display module.

The cover portion 323 includes a central portion 323c connected to the guide unit 310. The cover portion 323 includes one side portion 323a extending from the central portion 323c in the negative X-axis direction. The cover portion 323 includes the other side portion 323b extending from the central portion 323c in the positive X-axis direction. The central portion 323c, the one side portion 323a, and the other side portion 323b may be disposed in the same plane.

The base unit 320 includes a case guide 324 coupled to the case 360. A pair of case guides 324 may be provided. Each of the case guides 324 may be formed in the shape of a plate having a given thickness in the X-axis direction.

The case guides 324 may be disposed at opposite sides of the base unit 320 in the X-axis direction. The case guides 324 may be asymmetric from each other in the X-axis direction such that the case 360 is coupled to the base unit 320 only in a predetermined direction. The case guides 324 protrude from opposite sides in the X-axis direction. The case guides 324 protrude in the positive Y-axis direction. The case guides 324 include a first case guide 324a disposed in the negative X-axis direction and a second case guide 324b disposed in the positive X-axis direction. The first case guide 324a faces the side in the negative X-axis direction of the at least one PCB 330. The second case guide 324b faces the side in the positive X-axis direction of the at least one PCB 330.

A plurality of case guides 324 may be spaced apart from each other in the Z-axis direction. The display control module 3 may include a case guide 324 disposed at the distal end of the supporting member 30 in the Z-axis direction.

The supporting member 30 is provided with a connection hole 320h, through which the connection correspondence part 57 passes. The connection hole 320h is formed in the base unit 320. The connection hole 320h is formed in the cover portion 323. The connection hole 320h is formed in the one side portion 323a and the other side portion 323b. It is possible to easily and conveniently couple the connection correspondence part 57 to the connection terminal 331 using the connection hole 320h and to hide the connection correspondence part 57, which does not need to be visible, when images are output after the display device 1 is installed on site.

The connection hole 320h is formed through the base unit 320 in the Y-axis direction. A plurality of connection holes 320h may be spaced apart from each other in the direction in which the base unit 320 extends (i.e. the Z-axis direction). The connection holes 320h are disposed at positions corresponding to a plurality of connection correspondence parts 57. The number of connection holes 320h may be equal to the number of connection correspondence parts 57.

The guide unit 310 is provided at opposite sides thereof in the X-axis direction with a pair of connection holes 320h1 and 320h2. The connection holes 320h1 and 320h2 are formed through the cover portion 323 in the Y-axis direction. The connection holes 320h1 and 320h2 include a first connection hole 320h1 disposed in the negative X-axis direction and a second connection hole 320h2 disposed in the positive X-axis direction. The connection correspondence part 57 of the first display module 5a passes through the first connection hole 320h1. The connection correspondence part 57 of the second display module 5a passes through the second connection hole 320h2.

At least one PCB 330 controls the output of images from the display module 5. The PCB 330 controls a pair of display modules.

The PCB 330 is fixed to the supporting member 30. The PCB 330 is fixed to the base unit 320. The PCB 330 is fixed to the PCB coupling portion 321. The PCB 330 is coupled to the supporting member 30 in the positive Y-axis direction. The PCB 330 is coupled to the side of the supporting member 30 opposite the external coupling part 310c. The PCB 330 is disposed at the side surface of the base unit 320 in the positive Y-axis direction.

In the first to fourth embodiments shown in FIGS. 5A to 5D, the PCB coupling portion 321 is formed in the shape of a plate having a given thickness in the X-axis direction. The PCB coupling portion 321 is longer in the Y-axis direction than in the X-axis direction. The plate-shaped PCB 330 is fixed by the PCB coupling portion 321 in the state of having a given thickness in the X-axis direction. In the first to fourth embodiments, at least one PCB 330 is disposed such that the thickness of the PCB 330 in the X-axis direction is smaller than the width of the PCB 330 in the Y-axis direction. A plane of the PCB 330 is perpendicular to the display modules 5. The supporting member 30 is configured to support the PCB 330 in an upright position with respect to the display modules 5. When the user views images, therefore, the PCB 330 is hardly visible, and the width of the display control module 3 in the X-axis direction is relatively reduced, whereby output images are further emphasized.

In the fifth embodiment shown in FIG. 5E, a PCB coupling portion 321"" may be formed in the shape of a plate having a given thickness in the Y-axis direction. The PCB coupling portion 321"" is longer in the X-axis direction than in the Y-axis direction. The plate-shaped PCB 330 is fixed in the state of having a given thickness in the Y-axis direction. In the fifth embodiment, at least one PCB 330 is disposed such that the width of the PCB 330 in the X-axis direction is larger than the thickness of the PCB 330 in the Y-axis direction. Consequently, the direction in which the fastening member passes when the PCB 330 is fastened to the base unit 320 is perpendicular to the external surface, whereby the PCB 330 is fastened easily and conveniently.

The PCB 330 includes a connection terminal 331 configured to be electrically connected to the display module 5. At least one PCB 330 includes a pair of connection terminals 331a and 331b configured to be electrically connected to a pair of display modules 5a and 5b. The connection terminals 331a and 331b are disposed at opposite sides of the at least one PCB 330 in the X-axis direction. The connection terminals 331a and 331b correspondingly connects opposite surfaces of the at least one PCB 330 to the pair of display modules 5a and 5b. The connection terminals 331a and 331b include a first connection terminal 331a disposed in the negative X-axis direction and a second connection terminal 331b disposed in the positive X-axis direction. The first connection terminal 331a is electrically connected to the connection correspondence part 57 of the first display module 5a. The second connection terminal 331b is electrically connected to the connection correspondence part 57 of the second display module 5b. Consequently, the display modules 5a and 5b may be easily connected to the PCB 330, the length of the connection correspondence part 57 may be reduced, and the assembly structure of the display device may be simplified.

The first connection terminal 331a connects a first upright side (a upright side in the negative X-axis direction) of the PCB 330 to the first display module 5a. The second connection terminal 331b connects a second upright side (a upright side in the positive X-axis direction) of the PCB 330 to the second display module 5b.

The PCB 330 includes a board 332 on which the connection terminal 331 is disposed. A circuit is disposed on the board 332. The board 332 is formed in a plate shape.

The concerned display device 1 may be electrically connected to another display device 1 adjacent thereto. Here, one display device 1 means a unit including one display control module 3 and a pair of display modules 5. m display devices 1 may be electrically connected to each other such that images from a maximum of 2*m display modules 5 can be controlled simultaneously. The concerned display control module 3 may be electrically connected to another display control module 3 adjacent thereto. The PCB 330 of the concerned display control module 3 (hereinafter, referred to as the "concerned PCB") is configured to be connected to the PCB 330 of another display control module 3 adjacent thereto (hereinafter, referred to as the "adjacent PCB"). An image output signal may be transmitted from one to the other of the concerned PCB 330 and the adjacent PCB 330. Power necessary to output images may be transmitted from one to the other of the concerned PCB 330 and the adjacent PCB 330.

The PCB 330 may include a connector 336 configured to be electrically connected to another PCB 330. An image output signal may be transmitted from one to the other of the concerned PCB 330 and the adjacent PCB 330 via the connector 336. Power necessary to output images may be transmitted from one to the other of the concerned PCB 330 and the adjacent PCB 330 via the connector 336. The connector 336 may be disposed at the distal end of the PCB 330 in the Z-axis direction. A pair of connectors 336 may be disposed at opposite sides of the PCB 330 in the Z-axis direction. The concerned PCB 330 and the adjacent PCB 330 may be arranged in the Z-axis direction and may be connected to each other.

In the first, second, fourth, and fifth embodiments shown in FIGS. 5A, 5B, 5D, and 5E, at least one PCB 330 includes a board 332. The connection terminals 331a and 331b are disposed at opposite side surfaces of the board 332 in the X-axis direction. Consequently, it is sufficient to couple only one board 332 to the supporting member 30, thereby improving the convenience of on-site installation.

Meanwhile, in the third embodiment shown in FIG. 5C, at least one PCB 330" includes two PCBs 330a" and 330b".

The case 360 receives the PCB 330. The case 360 and the base unit 320 form an internal space for receiving the PCB 330. The case 360 is formed generally in the shape of '['. The case 360 may be formed by bending a plate. The side surface of the case 360 in the negative Y-axis direction is recessed in the positive Y-axis direction.

The case 360 includes a pair of side parts 363, into which a pair of case guides 324 is inserted. The side parts 363 form opposite side surfaces of the case 360 in the X-axis direction. The side parts 363 are spaced apart from each other in the X-axis direction. The side parts 363 are disposed so as to face each other. The side parts 363 are disposed outside the case guides 324. Inner surfaces of the side parts 363 contact outer surfaces of the case guides 324. The side parts 363 include a first side part 363a disposed in the negative X-axis direction and a second side part 363b disposed in the positive X-axis direction.

The case 360 includes an upper surface part 361 that extends and connects the side parts 363 to each other. The upper surface part 361 forms the side surface of the case 360 in the positive Y-axis direction. The upper surface part 361 is connected to the distal ends of the side parts 363 in the positive Y-axis direction. The upper surface part 361 may be spaced apart from the base unit 320 in the Y-axis direction.

The PCB 330 and the connection correspondence part 57 may be stably protected by the case 360.

Hereinafter, a process of installing the display device 1 according to the first to third and fifth embodiments (see FIGS. 5A to 5C and 5E) on site will be described.

First, the guide unit 310 is coupled to the external surface. At this time, the external coupling part 310c of the guide unit 310 is attached to the external surface.

Subsequently, the display modules 5a and 5b are attached to the external surface in the state in which the display modules 5a and 5b are in tight contact with the guide surfaces 310a and 310b. Specifically, the first display module 5a is attached to the external surface in the state in which the side end of the first display module 5a in the positive X-axis direction is in tight contact with the first guide surface 310a. In addition, the second display module 5b is attached to the external surface in the state in which the side end of the second display module 5b in the negative X-axis direction is in tight contact with the second guide surface 310b. When the display module comes into tight contact with the guide surfaces 310a and 310b, the connection correspondence part 57 is bent so as to protrude in the positive Y-axis direction.

Subsequently, the base unit 320 is fixed to the guide unit 310 using the fastening member 390. In the state in which the base unit 320 is disposed at the side surface of the guide unit 310 in the positive Y-axis direction, the fastening member 390 extends through the base unit 320 such that the base unit 320 is fixed to the guide unit 310. When the base unit 320 is disposed at the side surface of the guide unit 310 in the positive Y-axis direction, the connection correspondence parts 57 pass through the respective connection holes 320h.

Subsequently, the PCB 330 is fixed to the PCB coupling portion 321 of the base unit 320. In addition, the connection terminals 331 corresponding to the connection correspondence parts 57 are connected to each other.

Subsequently, the case 360 is coupled to the supporting member 30 along the case guide 324.

When the display device 1 according to the fourth embodiment (see FIG. 5D) is installed on site, the process of fixing the base unit 320 to the guide unit 310 using the fastening member 390 is not performed, since the guide unit 310 and the base 320 are formed integrally. The other processes are identical to the process of installing the display device 1 according to the first to third and fifth embodiments on site.

Hereinafter, the second to fifth embodiments will be described based on the difference from the first embodiment shown in FIG. 5A with reference to FIGS. 5B to 5E.

A display control module 3' according to the second embodiment shown in FIG. 5B includes at least one selected from between a sealing member 340' and a support 325'. A supporting member 30' may include a support 325'. A base unit 320' includes a support 325' protruding from the cover portion 323 in the negative Y-axis direction. A pair of supports 325' may be disposed at opposite sides of the guide unit 310 in the X-axis direction. The supports 325' may be disposed so as to be symmetric with respect to the guide unit 310 in the X-axis direction. The supports 325' may be formed in a protruding shape. The supports 325' are spaced apart from the guide surfaces 310a and 310b. The supports 325' are disposed so as to be spaced apart from the guide surfaces in the X-axis direction. The supports 325' are formed so as to contact the side surface of the display module 5 in the positive Y-axis direction.

In the second embodiment, the display control module 3' may include a sealing member 340' that fills the gap between the base unit 320' and the display module 5. The sealing member 340' is disposed at the side surface of the base unit 320' in the negative Y-axis direction. The sealing member 340' is disposed at the side surface of the display module 5 in the positive Y-axis direction. The sealing member 340' is disposed between the cover portion 323 and the display module 5. A pair of sealing members 340' may be disposed at opposite sides of the guide unit 310 in the X-axis direction. A pair of sealing members 340' may be disposed so as to be symmetric with respect to the guide unit 310 in the X-axis direction. The sealing members 340' may be formed in a protruding shape. The sealing members 340' may be spaced apart from the guide surfaces 310a and 310b. The sealing members 340' may be disposed so as to be spaced apart from the guide surfaces in the X-axis direction.

After the display device 1 is installed on site, the display module 5 may be pushed toward the external surface (i.e. in the negative Y-axis direction) using the supports 325' and/or the sealing members 340' to more stably fix the position of the display module 5 and to more safely protect the connection correspondence parts 57. Meanwhile, in the first embodiment, the side surface of the cover portion 323 in the negative Y-axis direction may directly contact the surface of the display module 5 in the positive Y-axis direction, or the side surface of the cover portion 323 in the negative Y-axis direction may be spaced apart from the surface of the display module 5 in the positive Y-axis direction.

In the second embodiment, in the case in which the display control module 3' includes both the support 325' and the sealing member 340', the sealing member 340' may be disposed outside the support 325'. A pair of sealing members 340' may be disposed outside a pair of supports 325'. The sealing members 340' may contact the supports 325'.

In the second embodiment, the width of the cover portion 323 in the X-axis direction may be greater than the width of the guide unit 310 in the X-axis direction in order to realize the supports 325' and/or the sealing members 340'.

A display control module 3" according to the third embodiment shown in FIG. 5C includes a pair of PCBs 330". A first PCB 330a" is disposed in the negative X-axis direction, and a second PCB 330b" is disposed in the positive X-axis direction. Both the first PCB 330a" and the second PCB 330b" may be fixed to a PCB coupling portion 321". A pair of connection terminals 332a" and 332b" is disposed at the PCBs 330a" and 330b". The first PCB 330a" includes a first board 332a" and a first connection terminal 331a". The second PCB 330b" includes a second board 332b" and a second connection terminal 331b".

In a display control module 3''' according to the fourth embodiment shown in FIG. 5D, the guide unit 310''' and the base unit 320''' are formed integrally, as previously described. In the display control module 3''' according to the fourth embodiment shown in FIG. 5D, a fastening member for fastening the guide unit 310''' and the base unit 320''' is not necessary.

A display control module 3'''' according to the fifth embodiment shown in FIG. 5E includes a PCB 330'''' configured such that the width of the PCB in the X-axis direction is larger than the thickness of the PCB in the Y-axis direction. A base unit 320'''' does not need a PCB coupling portion protruding in the Y-axis direction. Instead, the base unit 320'''' may include a PCB coupling portion 321'''' configured such that the width of the PCB coupling portion in the X-axis direction is larger than the thickness of the PCB coupling portion in the Y-axis direction. A pair of connection terminals 331*a* and 331*b* is disposed at opposite sides of the PCB 330''', which is disposed horizontally, in the X-axis direction.

Figure 6A:
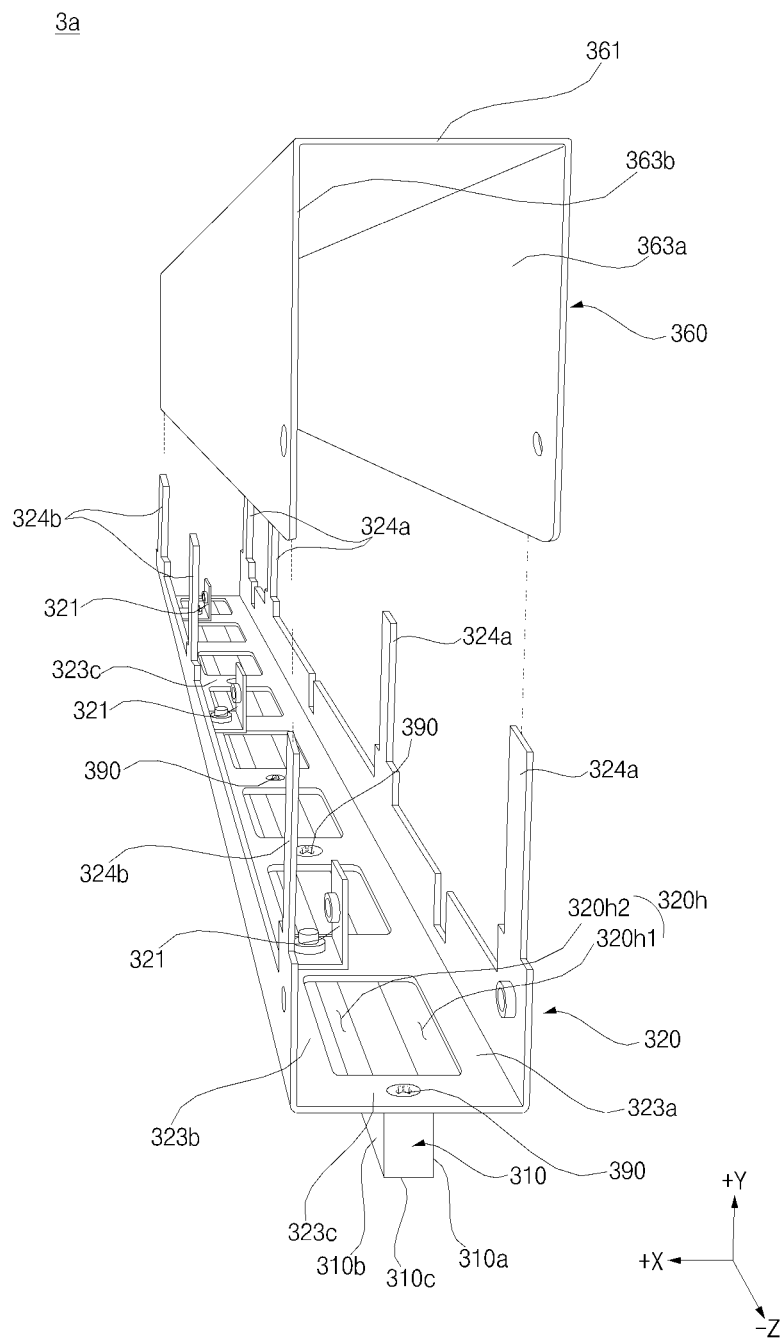
FIG. 6A is an exploded perspective view showing a guide unit, a base unit, and a case of a display control module according to an embodiment.

FIG. 6A is an exploded perspective view showing a guide unit 310, a base unit 320, and a case 360 of a display control module 3*a* according to an embodiment.

Figure 6B:
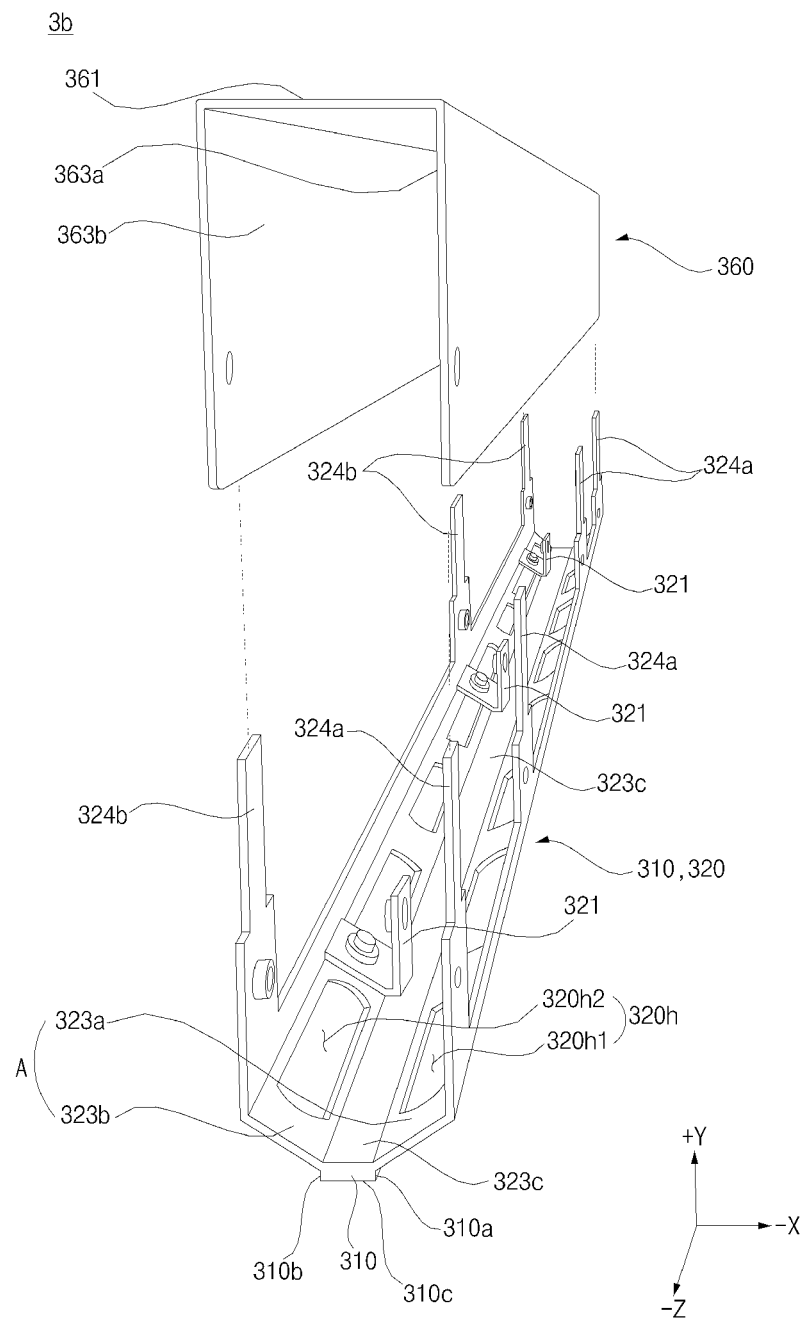
FIG. 6B is an exploded perspective view showing a guide unit, a base unit, and a case of a display control module according to another embodiment.

FIG. 6B is an exploded perspective view showing a guide unit 310, a base unit 320, and a case 360 of a display control module 3*b* according to another embodiment. The display control module 3*a* shown in FIG. 6A is identical to the display control module 3 according to the first embodiment.

Hereinafter, the display control module 3*b* will be described based on the difference between the display control module 3*b* and the display control module 3*a*. In the display control module 3*b*, the guide unit 310 and the base unit 320 are formed integrally. The side surface of a cover portion 323 in the negative Y-axis direction obliquely extends from the distal ends of a pair of guide surfaces in the positive Y-axis direction to a region between the X-axis direction and the positive Y-axis direction. The obliquely extending side surface of the cover portion 323 in the negative Y-axis direction may be referred to as an "angled portion A."

A pair of angled portions A may be formed so as to be symmetric with respect to the guide unit 310 in the X-axis direction. As the side surface of the angled portion A in the negative Y-axis direction becomes distant from the guide unit 310, the distance between the side surface of the angled portion A and the display module 5 in the Y-axis direction increases. One side part 323*a* of the display control module 3*b* obliquely extends from a central part 323*c* to a region between the negative X-axis direction and the positive Y-axis direction. The other side part 323*b* of the display control module 3*b* obliquely extends from the central part 323*c* to a region between the positive X-axis direction and the positive Y-axis direction. The oblique one side part 323*a* and the oblique other side part 323*b* constitute a pair of angled portions A.

When the display device 1 is installed on site, therefore, the side end of the display module 5 is easily and conveniently inserted into the gap between an external surface and the angled portions A such that the side end of the display module 5 contacts guide surfaces 310*a* and 310*b* in the state in which a supporting member 30, which includes the guide unit 310 and the base unit 320, is attached to an external surface.

As is apparent from the above description, the present invention has the effect of improving the convenience of attachment of the display device to the external surface when the display device is installed on site.

The display modules may be attached to the external surface in the state of being in contact with the guide unit, whereby the positions of the display modules relative to the display control module are adjusted accurately. Consequently, the display control module may also have a function of guiding the disposition of the display modules.

When the display device is installed on site, it is possible to easily dispose two facing side ends of the display modules so as to be parallel to each other through the guide surfaces. Consequently, it is possible to easily and conveniently align and install a plurality of display modules on site.

The X-axis direction length between the guide surfaces is configured to be smaller than the predetermined distance by which the LEDs are spaced apart from each other in the X-axis direction. Consequently, it is possible to prevent the closest LED of the first display module in the positive X-axis direction and the closest LED of the second display module in the negative X-axis direction from being excessively spaced apart from each other in the X-axis direction, thereby reducing a phenomenon in which images output from the first and second display modules are perceived by a user as being separated from each other.

The sum of the first length, the second length, and the X-axis direction length is configured to be the predetermined distance. Consequently, it is possible to improve a sense of unity of the images output from the first and second display modules.

The guide unit and the base unit are formed separately and fastened to each other. When the display device is installed on site, therefore, the guide unit, the display modules, and the base unit may be sequentially installed. Consequently, it is possible to easily and conveniently install the display modules in the state of being in contact with the guide unit without interference with the base unit. In addition, the side end of the display module that contacts the guide unit is easily and conveniently covered by the base unit.

The at least one PCB is disposed such that the thickness of the PCB in the X-axis direction is smaller than the width of the PCB in the Y-axis direction. When the user views images, therefore, the PCB is hardly visible, and the width of the display control module in the X-axis direction is relatively reduced.

The width of the cover portion in the X-axis direction is configured to be larger than the width of the guide unit in the X-axis direction. When the user views the display module in the negative Y-axis direction, therefore, it is possible to sufficiently secure the area of the side surface of the supporting member in the positive Y-axis direction at which the PCB is disposed while reducing an increase in the visible size of the border area of the display module.

It is possible to easily and conveniently couple the connection correspondence part to the connection terminal using the connection hole and to hide the connection correspondence part, which does not need to be visible, when images are output after the display device is installed on site.

The connection terminals are disposed at opposite sides of the PCB in the X-axis direction. Consequently, the display modules are easily connected to the PCB, the length of the connection correspondence part is reduced, and the assembly structure of the display device is simplified.

The connection terminals are disposed at opposite side surfaces of the board in the X-axis direction. Consequently, it is sufficient to couple only one board to the supporting member, thereby improving the convenience of on-site installation.

The PCB and the connection correspondence part may be stably protected by the case.

After the display device is installed on site, the display module may be pushed toward the external surface (i.e. in the negative Y-axis direction) using the supports and/or the sealing members to more stably fix the position of the display module and to more safely protect the connection correspondence parts.

When the display device is installed on site, the side end of the display module is easily and conveniently inserted into the gap between the external surface and the angled portions such that the side end of the display module contacts guide surfaces.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A transparent display comprising:
   a plurality of light emitting diodes (LED);
   a printed circuit board (PCB) positioned between at least two of the plurality of LEDs;
   a PCB support configured to support the PCB, wherein the PCB support comprises:
      a guide unit comprising an external coupling part for attaching to an external surface and a pair of guide surfaces forming opposite sides of the external coupling part, and
      a base unit connected to a side of the guide unit and coupled to the PCB, wherein a width of the base unit is greater than a width of the guide unit; and
   a plurality of connectors correspondingly connecting the PCB to the at least two of the plurality of LEDs.

2. The transparent display according to claim 1, wherein the PCB support is positioned between the at least two of the plurality of LEDs and configured to be attached to an external surface.

3. The transparent display according to claim 1, wherein the at least two of the plurality of LEDs are disposed on corresponding display modules which are configured such that side ends of the display modules contact the respective guide surfaces.

4. The transparent display according to claim 1, wherein the guide surfaces are disposed so as to be parallel to each other.

5. The transparent display according to claim 1, wherein:
   the at least two of the plurality of LEDs are disposed on corresponding display modules;
   each of the display modules comprises a plurality of LEDs spaced apart from each other by a predetermined distance; and
   a distance between the guide surfaces is smaller than the predetermined distance.

6. The transparent display according to claim 4, wherein:
   the at least two of the plurality of LEDs are disposed on corresponding display modules comprising a first display module and an adjacent second display module each comprising a plurality of LEDs arranged in rows;
   a first row of LEDs of the first display module is set apart from a side of the first display module by a first length; and
   a first row of LEDs of the second display module is set apart from a side of the second display module by a second length, wherein the sides of the first display module and the second display module face each other,
   wherein the PCB support is disposed between the first and second display modules such that a total length of the first length, the second length, and a width of the external coupling part is equal to the predetermined distance.

7. The transparent display according to claim 1, wherein the at least two of the plurality of LEDs are disposed on corresponding display modules and the transparent display further comprises a sealing member disposed at a side surface of the base unit to fill a gap between the base unit and the display modules.

8. The transparent display according to claim 1, wherein:
   the at least two of the plurality of LEDs are disposed on corresponding display modules disposed on opposite sides of the PCB support;
   the PCB comprises a pair of connection terminals configured to be electrically connected to the corresponding display modules;
   each of the display modules comprise connection correspondence parts disposed at opposing sides and configured to be connected to a corresponding connection terminal; and
   the PCB support is comprises connection holes configured to allow the connection correspondence parts to pass therethrough.

9. The transparent display according to claim 1, wherein:
   the PCB support comprises a pair of case guides protruding upward from opposite sides of the supporting member; and
   the transparent display further comprises a case configured to enclose the PCB and comprising a pair of side parts configured to engage the case guides to secure the case to the PCB support.

* * * * *